United States Patent [19]
Yu

[11] Patent Number: 5,747,373
[45] Date of Patent: May 5, 1998

[54] NITRIDE-OXIDE SIDEWALL SPACER FOR SALICIDE FORMATION

[75] Inventor: Chen-Hua Yu, Hsin-chu, Taiwan

[73] Assignee: Taiwan Semiconductor Manufacturing Company Ltd., Hsin-Chu, Taiwan

[21] Appl. No.: 719,233

[22] Filed: Sep. 24, 1996

[51] Int. Cl.$^6$ .................................................. H01L 21/00
[52] U.S. Cl. ................................................ 438/305; 438/306
[58] Field of Search ................................. 438/303, 306, 438/307, 305

[56] References Cited

U.S. PATENT DOCUMENTS

| | | | |
|---|---|---|---|
| 5,411,906 | 5/1995 | Johnson et al. | 437/44 |
| 5,498,555 | 3/1996 | Lin | 437/35 |
| 5,518,940 | 5/1996 | Hodate et al. | 437/41 |
| 5,518,945 | 5/1996 | Bracchitta et al. | 437/44 |

Primary Examiner—John Niebling
Assistant Examiner—Michael S. Lebentritt
Attorney, Agent, or Firm—George O. Saile; Stephen B. Ackerman

[57] ABSTRACT

A method of fabricating a MOSFET device structure, featuring a double insulator spacer, and improved source and drain engineering, has been developed. A silicon nitride—silicon oxide, double spacer, is used to prevent thinning of the insulator spacer, during a buffered hydrofluoric acid procedure, used prior to a metal deposition and metal silicide formation. A lightly doped source and drain region is formed prior to creation of the silicon oxide spacer, a medium doped source and drain region is formed prior to creation of the silicon nitride spacer, and a heavily doped source and drain region is formed following the creation of the silicon nitride spacer. This source and drain configuration increases device performance and reliability.

15 Claims, 2 Drawing Sheets

NITRIDE-OXIDE SIDEWALL SPACER FOR SALICIDE FORMATION

BACKGROUND OF THE INVENTION (1) Field of the Invention

The present invention relates to a method of fabricating a metal oxide semiconductor field effect transistor, (MOSFET), device, and more specifically to a method of reducing gate to substrate shorting during the metal silicide formation processes.

(2) Description of Prior Art

The semiconductor industry is continually striving to improve the performance of MOSFET devices. The ability to create devices with sub-micron features has allowed significant decreases, in performance degrading parasitic capacitances, and resistances, to be achieved, thus resulting in performance benefits. The attainment of sub-micron features has been accomplished via advances in several semiconductor fabrication disciplines. For example in photolithograhy the development of more sophisticated exposure cameras, as well as the use of more sensitive photoresist materials have allowed sub-micron features, in photoresist layers, to be routinely achieved. In addition the development of more advanced dry etching tools and processes have allowed the sub-micron images in photoresist layers to be successfully transferred to underlying materials used in MOSFET structures. In addition to contributions supplied by advances in MOSFET processing disciplines, performance improvements have also been realized via the use of more conductive materials. For example the use of polycide gate structures, a gate structure comprised of a metal silicide layer overlying a polysilicon layer, has significantly reduced the resistance of the gate structure, when compared to the previously used polysilicon gate structures. Polycide gate formation, when performed using a salicide process, (Self-ALigned-silICIDE), also results in the conductive metal silicide overlying source and drain regions, resulting in performance benefits.

The ability to achieve successful salicide formation is dependent on the integrity of the insulator spacers, on the sides of the polysilicon gate structure, during the salicide formation procedure. For example prior to metal deposition, native oxide on the exposed top surface of the polysilicon gate structure, as well as the top surface of the source and drain region, has to be removed, to allow the subsequent metal silicide formation to be successful. Native oxide will prevent the reaction between the metal and the exposed silicon surfaces during an anneal cycle. Therefore a buffered hydrofluoric acid procedure is used prior to metal deposition. However if the insulator spacer, on the sides of the polysilicon gate structure, becomes defective, or significantly thinned, exposing polysilicon, as a result of the buffered hydrofluoric acid, metal pre-clean procedure, unwanted metal silicide formation, or metal silicide bridging, can occur on the sides of the polysilicon gate structure, resulting in gate to substrate shorting or leakages.

This invention will describe a process in which a double insulator spacer is used to prevent the metal silicide bridging phenomena, as well as allowing additional resistance decreases to be achieved via source and drain engineering procedures. After formation of a lightly doped source and drain region, a first, silicon oxide spacer is formed on the sides of the polysilicon gate, followed by the creation of a medium doped source and drain region. A second insulator spacer, silicon nitride, is then created, followed by the formation of a heavily doped source and drain region. A significant metal pre-clean procedure, using buffered hydrofluoric acid, can now be performed, without risking the integrity of the silicon nitride—silicon oxide spacer insulator, increasing the prospects of a successful salicide procedure. Prior art, such as Bracchita, et al, in U.S. Pat. No. 5,518,945, describe an insulator spacer, comprised of two materials, a silicon nitride—doped oxide composite. However that prior art does not teach the concept of creating two insulator spacers, allowing an additional source and drain procedure, to be performed between insulator spacer procedures.

SUMMARY OF THE INVENTION

It is an object of this invention to fabricate a MOSFET device using a salicide process.

It is another object of this invention to use a double insulator spacer structure, to prevent thinning of the insulator spacer during the metal pre-clean procedure, and thus prevent gate to substrate, metal silicide bridging from occurring during the salicide formation procedure.

It is yet another object of this invention to decrease MOSFET device resistance by forming a medium doped source and drain region, after formation of the first insulator spacer, but before the formation of the second insulator spacer.

In accordance with the present invention a method of creating a MOSFET device, with a polycide gate, a double insulator spacer, and a three stage source and drain region, is described. After formation of field oxide regions, a gate insulator layer is grown. A polysilicon layer is deposited, doped and patterned to create a polysilicon gate structure. A lightly doped source and drain region is formed, defined by the polysilicon gate structure. A silicon oxide, first spacer is formed on the sides of the polysilicon gate structure, followed by the creation of a medium doped source and drain region, defined by the first insulator polysilicon gate structure. A silicon nitride, second spacer is formed on the sides of the silicon oxide, first spacer, resulting in a double insulator spacer, on the polysilicon gate structure, and used to define the heavily doped source and drain region. After a buffered hydrofluoric acid pre-clean, a metal deposition is performed, followed by an anneal cycle, used to convert exposed silicon areas, the top surface of the polysilicon gate structure, and the top surfaces of the source and drain regions, to metal silicide. Unreacted metal, overlying the double insulator spacer, is then selectively removed resulting in the polycide gate structure, comprised of metal silicide overlying a polysilicon gate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
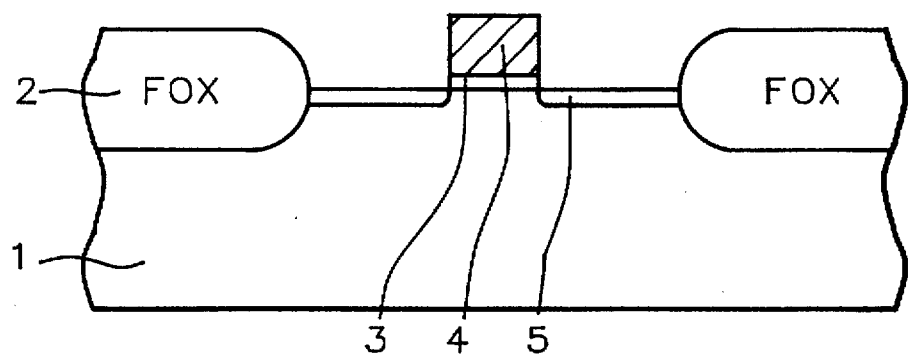
FIGS. 1–5, which schematically, in cross sectional style, illustrate the key fabrication stages used to create a MOSFET device, using a double insulator spacer, with improve source and drain engineering.

The method of forming a MOSFET device with a double insulator spacer, and with improved source and drain engineering, will now be described in detail. A P type, substrate, 1, consisting of single crystalline silicon, with a <100>crystallographic orientation, is used. Thick field oxide, (FOX), regions, 2, are formed for isolation purposes. The FOX regions, shown schematically in FIG. 1, are formed via thermal oxidation, in an oxygen—steam ambient, at a temperature between about 850° to 1050° C., to a thickness between about 4000 to 6000 Angstroms. Oxidation is prevented in non-isolation, device regions, via use of a patterned, composite oxidation resistant mask, consisting of an overlying silicon nitride layer and an underlying pad oxide layer. After the creation of FOX regions, 2, the composite mask is removed using a hot phosphoric acid solution for the silicon nitride layer, and a buffered hydrofluoric acid solution for the pad oxide layer. A layer of silicon dioxide, 3, used as the gate insulator layer, is then thermally grown, in an oxygen—steam ambient, at a temperature between about 850° to 1000° C., to a thickness between about 50 to 200 Angstroms. A polysilicon layer is next deposited via low pressure chemical vapor deposition, (LPCVD), procedures, at a temperature between about 600° to 800° C., to a thickness between about 500 to 5000 Angstroms. The polysilicon layer can be grown intrinsically and doped via ion implantation of either phosphorous or arsenic, at an energy between about 25 to 75 KeV, at a dose between about 1E14 to 1E16 atoms/cm$^2$, or the polysilicon layer can be grown using insitu doping procedures, adding either phosphine or arsine to a silane ambient. Conventional photolithographic, and reactive ion etching, (RIE), procedures, using $Cl_2$ as an etchant, are used to create polysilicon gate structure, 4, shown schematically in FIG. 1, with polysilicon gate structure having a width between about 0.05 to 2.0 uM. Photoresist removal is performed using plasma oxygen ashing, and careful wet cleans. A lightly doped source and drain region, 5, is next formed in semiconductor substrate, 1, via ion implantation of phosphorous or arsenic, at an energy between about 5 to 100 KeV, at a dose between about 1E11 to 1E14 atoms/cm$^2$. This is also illustrated schematically in FIG. 1.

Figure 2:
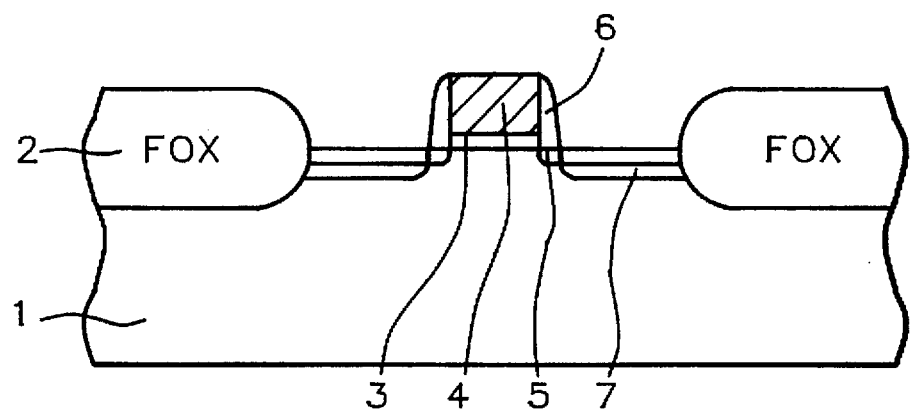

A first insulator spacer, 6, shown schematically in FIG. 2, is next created. First insulator spacer, 6, is formed by initially depositing a first insulator layer of silicon oxide, via either LPCVD, or plasma enhanced chemical vapor deposition, (PECVD), procedures, at a temperature between about 300° to 800° C., to a thickness between about 200 to 5000 Angstroms. The layer of silicon oxide used in the formation of first insulator spacer, 6, can also be obtained via thermal oxidation procedures, if desired. A selective, anisotropic RIE procedure, using $CHF_3$, or $CF_4$ —$O_2$—He as an etchant is used to create first insulator spacer, 6, on the sides of polysilicon gate structure, 4. The selective RIE procedure is terminated when the laser endpoint detects silicon, exposed in the lightly doped source and drain region, 5, as well as silicon exposed in the top surface of polysilicon gate structure, 4. The width of first insulator spacer, 6, is approximately equal to the thickness of the deposited silicon oxide layer, between about 200 to 5000 Angstroms. Therefore if a heavily doped source and drain region were to be next processed, using only first insulator spacer, 6, as the spacer, too much lateral diffusion may occur, compensating more of the lightly doped source and drain region then desired, adversely influencing injection of hot electron carriers, and thus introducing reliability concerns. In addition if only first insulator spacer, 6, is used for subsequent salicide processing, the pre-metal clean, in a buffered hydrofluoric acid solution, may thin first insulator spacer, 6, to a point in which gate to substrate shorts or leakage, can occur due to metal silicide bridging. Therefore this invention addresses both compensation of the lightly doped source and drain regions and metal bridging, via the next series of process sequences.

After formation of first insulator spacer, 6, a medium doped source and drain region, 7, is created, and shown schematically in FIG. 2. This is accomplished via ion implantation of arsenic or phosphorous, at an energy between about 5 to 50 KeV, at a dose between about 1E12 to 5E14 atoms/cm$^2$. This medium doped source and drain region will not be as heavily doped as a subsequent source and drain region, needed for contact purposes. Therefore less lateral diffusion will occur, resulting in less lightly doped source and drain region compensation, and thus reducing the risk of hot electron carrier injection that existed with the heavily doped source and drain procedure. In addition the medium source and drain region, 7, reduces the resistance of the lightly doped source and drain region, 5, underlying first insulator spacer, 6, thus improving performance.

Figure 3:
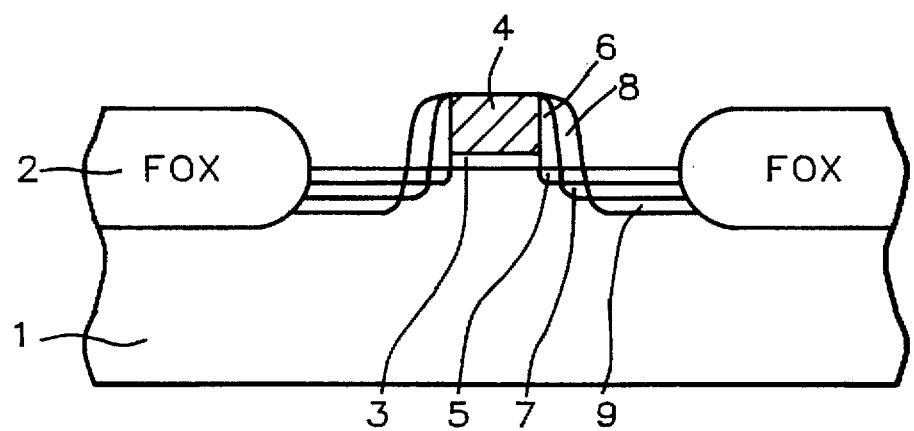

FIG. 3, shows the creation of a second insulator spacer, 8. A second insulator layer of silicon nitride is deposited via LPCVD or PECVD procedures, at a temperature between about 200° to 800° C., to a thickness between about 200 to 5000 Angstroms. Selective, anisotropic RIE procedures, using $CHF_3$ or $SF_6$ —$O_2$ as an etchant are then employed to form second insulator spacer, 8. Laser endpoint detection again allows the RIE procedure to terminate at the appearance of silicon. Also shown in FIG. 3, is the creation of the heavily doped source and drain region, 9, needed for low resistance contacts. This is achieved via ion implantation of arsenic, at an energy between about 5 to 150 KeV, at a dose between about 1E15 to 1E16 atoms/cm$^2$. An anneal cycle is performed, using rapid thermal anneal, (RTA), procedures, at a temperature between about 800° to 1100° C., for between about 5 to 120 sec., to activate the dopants in the source and drain regions.

Figure 4:
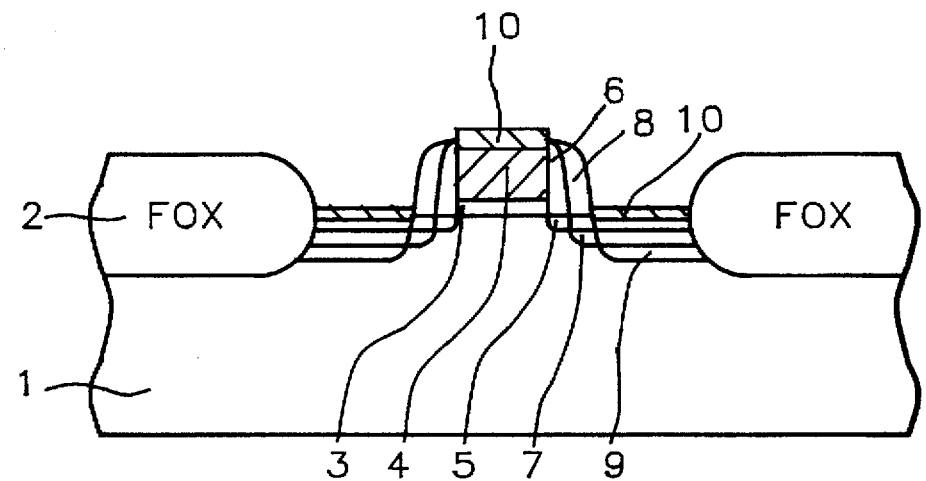

The Self-ALigned silICIDE, (salicide), process is next addressed. First a metal pre-clean of the surfaces, needed to remove native oxide from exposed silicon areas, is performed. This is accomplished via a buffered hydrofluoric acid treatment, for a time between about 5 to 120 sec. If the second insulator spacer, 8, of silicon nitride, were not used, the first insulator spacer, 6, of silicon oxide, may not have withstood the metal pre-clean procedure. The thin, first insulator spacer, 6, may have become defective due to thinning, and thus would not prevent metal silicide formation on the sides of the polysilicon gate structure, 4, resulting in possible gate to substrate shorts or leakage. After the metal pre-clean procedure, a layer of titanium is deposited, via r.f. sputtering procedures, to a thickness between about 50 to 1000 Angstroms. A rapid thermal anneal, (RTA), procedure, at a temperature between about 550° to 700° C., for a time between about 20 to 90 sec., is used to form titanium silicide layer, 10, on heavily doped source and drain regions, 9, and the top surface of polysilicon gate structure, 4. Unreacted titanium, residing on the surface of second insulator spacer, 8, as well as on the surface of FOX region, 2, is selectively removed using a solution of $H_2O_2$—$H_2SO_4$. Therefore self-aligned, titanium silicide layers are created. The polycide gate structure of titanium silicide layer, 10, overlying polysilicon gate structure, 4, is schematically shown in FIG. 4.

Figure 5:
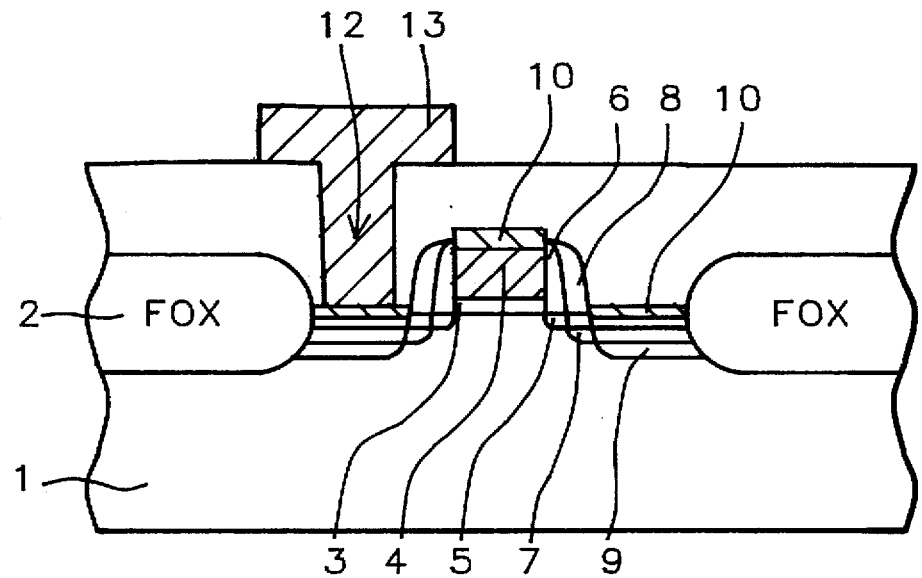

FIG. 5, shows the formation of metal contacts to metal silicided, heavily doped source and drain region, 9. Metal contact formation is also made to the polycide structure, although not shown in FIG. 5. First a silicon oxide layer, 11, is deposited via PECVD procedures, at a temperature between about 350° to 450° C., to a thickness between about 3000 to 6000 Angstroms. Conventional photolithographic and RIE procedures, using $CHF_3$ as an etchant, are used to open contact hole, 12. Photoresist is removed via plasma oxygen ashing and careful wet cleans. A layer of aluminum, containing between about 1 to 3% copper, and between about 0.5 to 1% silicon, is deposited via r.f. sputtering procedures, to a thickness between about 4000 to 8000 Angstroms. Conventional photolithographic and RIE procedures, using $Cl_2$ as an etchant, are used to create metal contact structure, 13, schematically shown in FIG. 5. Photoresist is once again removed via plasma oxygen ashing and careful wet cleans.

This process for fabricating a MOSFET device using a double insulator spacer, and improved source and drain engineering, although shown for a N channel MOSFET device, can also be applied to P channel MOSFETs, to complimentary, (CMOS), devices, as well as applied to bipolar - CMOS, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, using a silicon nitride—silicon oxide, double insulator spacer, and featuring a lightly doped source and drain region, a medium doped source and drain region, and a heavily doped source and drain region, comprising the steps:

forming field oxide regions in said semiconductor substrate;

growing a gate insulator layer on regions of said semiconductor substrate, not covered by said field oxide regions;

growing a polysilicon layer on said gate insulator layer and on said field oxide regions;

patterning of said polysilicon layer to create a polysilicon gate structure, on said gate insulator layer;

ion implanting a first conductivity imparting dopant into a region of said semiconductor substrate, not covered by said polysilicon gate structure, and not covered by said field oxide region, to create said lightly doped source and drain region;

depositing a silicon oxide layer on said polysilicon gate structure, on said lightly doped source and drain region, and on said field oxide regions;

anisotropic etching of said silicon oxide layer to create a silicon oxide spacer, on the sides of said polysilicon gate structure;

ion implanting a second conductivity imparting dopant into a region of said semiconductor substrate, not covered by said polysilicon gate structure, not covered by said silicon oxide spacer, and not covered by said field oxide region, to create said medium doped source and drain region;

deposition of a silicon nitride layer on said polysilicon gate structure, on said silicon oxide spacer, on said medium doped source and drain region, and on said field oxide region;

anisotropic etching of said silicon nitride layer to create a silicon nitride spacer, resulting in said silicon nitride—silicon oxide, double insulator spacer, on the sides of said polysilicon gate structure;

ion implanting a third conductivity imparting dopant into a region of said semiconductor substrate, not covered by said polysilicon gate structure, not covered by said silicon nitride—silicon oxide, double insulator spacer, and not covered by said field oxide regions, to create said heavily doped source and drain regions;

a first anneal cycle, performed using a rapid thermal anneal procedure, at a temperature between about 800° to 1100° C. for a time of about 5 to 120 sec., used to activate the dopants in said heavily doped source and drain region, in said medium doped source and drain region, and in said lightly doped source and drain region;

a buffered hydrofluoric acid, titanium pre-clean procedure, for a time between about 5 to 120 sec;

depositing a titanium layer on the exposed top surface of said polysilicon gate structure, on the exposed top surface of said heavily doped source and drain region, on the surface of said silicon nitride—silicon oxide, double insulator spacer, and on said field oxide regions;

a second anneal cycle used to form a titanium silicide layer on the exposed top surface of said polysilicon gate structure, and on the exposed top surface of said heavily doped source and drain region, while leaving said titanium layer, unreacted on the surface of said silicon nitride—silicon oxide, double insulator spacer, and on the surface of said field oxide regions; and removal of unreacted, said titanium layer, from the surface of said silicon nitride—silicon oxide, double insulator spacer, and from said field oxide regions, resulting in a polycide gate structure, comprised of said titanium silicide, layer overlying said polysilicon gate structure, and of said titanium silicide layer, overlying said heavily doped source and drain region.

2. The method of claim 1, wherein said gate insulator layer is silicon dioxide, thermally grown in an oxygen steam ambient, at a temperature between about 850° to 1000° C., to a thickness between about 50 to 200 Angstroms.

3. The method of claim 1, wherein said polysilicon layer is deposited using LPCVD procedures, at a temperature between about 600° to 800° C., to a thickness between about 500 to 5000 Angstroms.

4. The method of claim 1, wherein said polysilicon gate structure is between about 0.05 to 2.0 uM in width, formed via RIE of said polysilicon layer, using $Cl_2$ as an etchant.

5. The method of claim 1, wherein said first conductivity imparting dopant, used to create said lightly doped source and drain region, is phosphorous, ion implanted at an energy between about 5 to 100 KeV, at a dose between about 1E11 to 1E14 atoms/$cm^2$.

6. The method of claim 1, wherein said silicon oxide layer is deposited using LPCVD or PECVD procedures, at a temperature between about 300° to 800° C., to a thickness between about 200 to 5000 Angstroms.

7. The method of claim 1, wherein said silicon oxide spacer is formed via anisotropic RIE of said silicon oxide layer, using $CHF_3$, or $CF_4$—$O_2$—He as an etchant.

8. The method of claim 1, wherein said second conductivity imparting dopant, used to create said medium doped source and drain region, is arsenic or phosphorous, ion implanted at an energy between about 5 to 50 KeV, at a dose between about 1E12 to 5E14 atoms/$cm^2$.

9. The method of claim 1, wherein said silicon nitride layer is deposited using LPCVD or PECVD procedures, at a temperature between about 200° to 800° C., to a thickness between about 200 to 5000 Angstroms.

10. The method of claim 1, wherein said silicon nitride spacer is formed via anisotropic RIE of said silicon nitride layer, using $CHF_3$ or $SF_6$—$O_2$ as an etchant.

11. The method of claim 1, wherein said third conductivity imparting dopant, used to create said heavily doped source and drain region, is arsenic, ion implanted at an energy between about 5 to 150 KeV, at a dose between about 1E15 to 1E16 atoms/cm$^2$.

12. The method of claim 1, wherein said titanium pre-clean is performed using a buffered hydrofluoric acid solution, for a time between about 5 to 120 sec.

13. The method of claim 1, wherein said titanium layer is deposited using r.f. sputtering procedures, to a thickness between about 50 to 1000 Angstroms.

14. The method of claim 1, wherein said titanium silicide layer is formed using RTA procedures, at a temperature between about 550° to 700° C., for a time between about 20 to 90 sec.

15. The method of claim 1, wherein contact holes are opened in an insulator layer, exposing top surface of said polycide structure, and exposing top surface of said heavily doped source and drain regions, followed by deposition of an aluminum based layer, and patterning of said aluminum based layer, using a $Cl_2$, RIE procedure, to form aluminum contact structures to said polycide structure, and to said heavily doped source and drain region.

* * * * *